United States Patent
Cho

(10) Patent No.: US 10,748,638 B2
(45) Date of Patent: Aug. 18, 2020

(54) MEMORY CONTROLLER AND MEMORY SYSTEM HAVING THE SAME

(71) Applicant: SK hynix Inc., Gyeonggi-do (KR)

(72) Inventor: Dae Gon Cho, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 64 days.

(21) Appl. No.: 16/120,801

(22) Filed: Sep. 4, 2018

(65) Prior Publication Data

US 2019/0237151 A1   Aug. 1, 2019

(30) Foreign Application Priority Data

Jan. 26, 2018   (KR) .......................... 10-2018-0009994

(51) Int. Cl.
  *G11C 29/38*   (2006.01)
  *G11C 29/36*   (2006.01)
  *G11C 29/02*   (2006.01)
  *G11C 29/44*   (2006.01)

(52) U.S. Cl.
  CPC .............. *G11C 29/38* (2013.01); *G11C 29/02* (2013.01); *G11C 29/36* (2013.01); *G11C 2029/4402* (2013.01)

(58) Field of Classification Search
  CPC ......... G11C 29/38; G11C 29/02; G11C 29/36; G11C 2029/4402
  See application file for complete search history.

(56) References Cited

U.S. PATENT DOCUMENTS

| 5,903,576 A | * | 5/1999 | Yoshiba | G01R 31/31926 |
| | | | | 714/720 |
| 2005/0278147 A1 | * | 12/2005 | Morton | G06F 11/2273 |
| | | | | 702/183 |
| 2014/0157045 A1 | * | 6/2014 | Kim | G11C 29/76 |
| | | | | 714/6.13 |
| 2017/0110206 A1 | * | 4/2017 | Ryu | G11C 29/44 |
| 2017/0123881 A1 | * | 5/2017 | Seo | G06F 11/1417 |
| 2018/0158535 A1 | * | 6/2018 | Kim | G11C 29/783 |
| 2019/0171540 A1 | * | 6/2019 | Xu | G06F 11/30 |
| 2019/0229753 A1 | * | 7/2019 | Cha | G06F 11/1044 |

FOREIGN PATENT DOCUMENTS

KR   101255265   4/2013

* cited by examiner

*Primary Examiner* — Kyle Vallecillo
(74) *Attorney, Agent, or Firm* — IP & T Group LLP

(57) ABSTRACT

There are provided a memory controller and a memory system having the same. A memory controller includes: an internal memory for storing error injection information for an error test operation and error test information that is a result of the error test operation; and a central processing unit for receiving first sector data from a host, and performing an error test operation on a memory device according to the error injection information, when the error injection information is included in the first sector data.

19 Claims, 8 Drawing Sheets

MEMORY CONTROLLER AND MEMORY SYSTEM HAVING THE SAME

CROSS-REFERENCE TO RELATED APPLICATION

The present application claims priority under 35 U.S.C. § 119(a) to Korean patent application number 10-2018-0009994, filed on Jan. 26, 2018, which is incorporated herein by reference in its entirety.

BACKGROUND

1. Field of Invention

Various embodiments of the present disclosure relate to a memory controller and a memory system including the memory controller. Particularly, the embodiments relate to a memory controller for performing an error test and a memory system including the memory controller.

2. Description of Related Art

A memory system may include a memory device and a memory controller.

The memory device may store data and output the stored data. The memory device may be configured as a volatile memory device in which stored data is lost when power supply is interrupted, or be configured as a nonvolatile memory device in which stored data is retained even when power supply is interrupted.

The memory controller may control data communication between a host and the memory device.

The host may communicate with the memory device through the memory controller by using an interface protocol such as peripheral component interconnect-express (PCI-E), advanced technology attachment (ATA), serial ATA (SATA), parallel ATA (DATA), or serial attached SCSI (SAS). Other interface protocols between the host and the memory system that may be used include a universal serial bus (USB), a multi-media card (MMC), an enhanced small disk interface (ESDI), and integrated drive electronics (IDE).

When the error processing performance of the memory system was tested, a specific command such as a vendor command from the host was typically used. However, such a specific command should be set differently depending on protocols between the host and the memory system, and hence there is a limitation in testing.

SUMMARY

Embodiments provide a memory controller capable of performing an error test without limiting any protocol between a host and a memory system, and a memory system having the memory controller.

According to an aspect of the present disclosure, there is provided a memory controller including: an internal memory configured to store error injection information for an error test operation and error test information that is a result of the error test operation; and a central processing unit configured to receive first sector data from a host, and perform an error test operation on a memory device according to the error injection information, when the error injection information is included in the first sector data.

According to an aspect of the present disclosure, there is provided a memory system including: a memory device configured to store data; and a memory controller configured to receive error injection information from a host, perform an error test operation on the memory device by generating a program, read or erase command according to the error injection information, and output error test information that is a result of the error test operation to the host.

According to an aspect of the present disclosure, there is provided a memory system including: a memory device; and a memory controller including an internal memory configured to store externally provided error test operation information in the internal memory, and control the memory device to perform an error test operation according to the error test operation information in response to an error test request provided from an external source, wherein the controller requests, when the error test operation information is stored in the internal memory, the error test request from the external source.

BRIEF DESCRIPTION OF THE DRAWINGS

Various embodiments will now be described more fully with reference to the accompanying drawings; however, elements and features of the present disclosure may be configured or arranged differently than shown or described herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, embodiments of the present disclosure are shown and described simply by way of example. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more other components rather than excluding such other component(s), unless the context indicates otherwise. Also, throughout the specification, reference to "an embodiment" or the like is not necessarily to only one embodiment, and different references to "an embodiment" or the like are not necessarily to the same embodiment(s).

The terminology used herein is for the purpose of describing particular embodiments only and is not intended to be limiting of the present invention.

As used herein, singular forms may include the plural forms as well and vice versa, unless the context clearly indicates otherwise.

Figure 1:
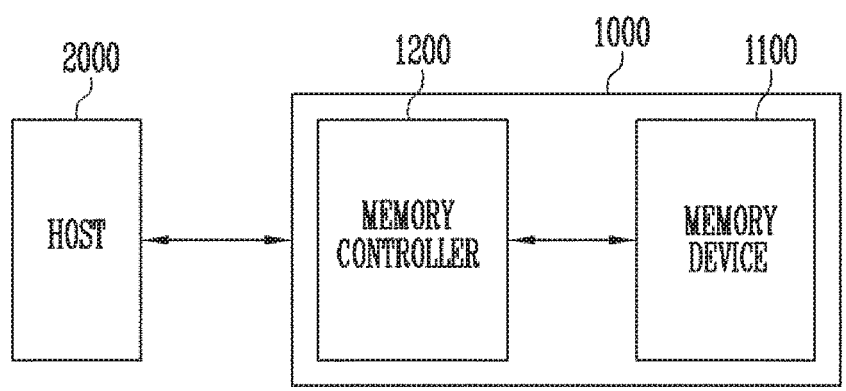
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-described examples; any of various other interface protocols such as a Universal Serial Bus (USB), a Multi-Media Card (MMC), an Enhanced Small Disk Interface (ESDI), and Integrated Drive Electronics (IDE) may be used instead.

The memory controller 1200 may control overall operations of the memory system 1000, and control data exchange between the host 2000 and the memory device 1100. For example, the memory controller 1200 may modify received information such that commands, addresses, and data can be communicated between the host 2000 and the memory device 1100, and store and output the modified information. For example, the memory controller 1200 may control the memory device 1100 to perform a program, read or erase operation.

The memory controller 1200 according to an embodiment may control the memory device 1100 to perform a cache read operation by generating a cache read command. The memory device 1100 may temporarily store read data in specific latches in response to the cache read command, and simultaneously output previously read data when next data is read. In the cache read operation, the memory controller 1200 may manage data read last in the cache read operation according to an operation after the cache read operation.

The memory device 1100 may be configured to store data. For example, the memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and a flash memory.

Figure 2:
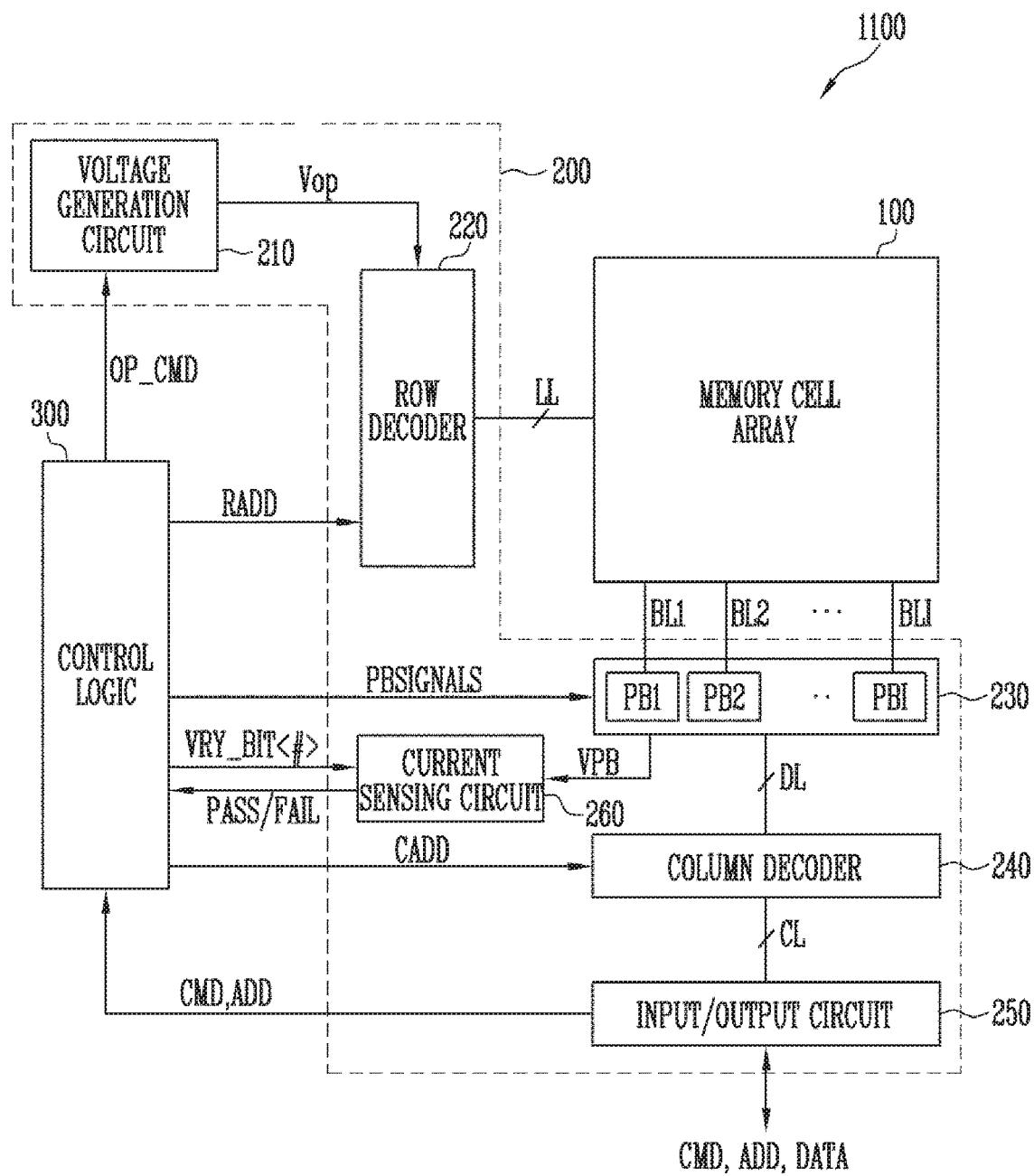
FIG. 2 is a diagram illustrating in detail a memory device of FIG. 1.

FIG. 2 is a diagram illustrating in detail the memory device of FIG. 1.

Referring to FIG. 2, the memory device 1110 may include a memory cell array 100 that stores data. The memory device 1110 may include peripheral circuits 200 configured to perform a program operation for storing data in the memory cell array 100, a read operation for outputting the stored data, and an erase operation for erasing the stored data. The memory device 1110 may include a control logic 300 that controls the peripheral circuits 200 under the control of the memory controller 1200 (of FIG. 1).

The memory cell array 100 may include a plurality of memory blocks. User data and information necessary for an operation of the memory device 1100 may be stored in the memory blocks. The memory blocks may be implemented in a two-dimensional or three-dimensional structure. Recently, memory blocks have been mainly implemented in the three-dimensional structure. For example, memory blocks having the two-dimensional structure may include memory cells arranged in parallel to a substrate, and memory blocks having the three-dimensional structure may include memory cells stacked vertically to a substrate.

The peripheral circuits 200 may be configured to perform program, read, and erase operations under the control of the control logic 300. For example, the peripheral circuits 200 may include a voltage generation circuit 210, a row decoder 220, a page buffer group 230, a column decoder 240, an input/output circuit 250, and a current sensing circuit 260.

The voltage generation circuit 210 may generate various operating voltages Vop used for program, read, and erase operations in response to an operation signal OP_CMD. For example, the voltage generation circuit 210 may generate a program voltage, a verify voltage, a pass voltage, a compensation program voltage, a read voltage, an erase voltage, a turn-on voltage, and the like under the control of the control logic 300.

The row decoder 220 may transfer the operating voltages Vop to local lines LL coupled to a selected memory block among the memory blocks of the memory cell array 100 in response to a row address RADD. The local lines LL may include local word lines, local drain select lines, and local source select lines. In addition, the local lines LL may include various lines such as a source line, which are coupled to the memory block.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI, or sense voltages or currents of the bit lines BL1 to BLI in a read or verify operation. Each of the page buffers PB1 to PBI may include a plurality of latches capable of temporarily storing data. For example, each of the page buffers PB1 to PBI may include at least three latches so as to perform a cache read operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through column lines CL.

The input/output circuit 250 may transfer a command CMD and an address ADD, which are received from the memory controller (1200 of FIG. 1), to the control logic 300, or communicate data DATA with the column decoder 240.

In a read operation or a verify operation, the current sensing circuit 260 may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIG-NALS, and the permission bit VRY_BIT<#> in response to the command CMD and the address ADD. Also, the control logic 300 may determine whether the verify operation has passed or failed in response to the pass or fail signal PASS or FAIL. For example, the control logic 300 may perform a test operation on various operations in response to an error test command.

Figure 3:
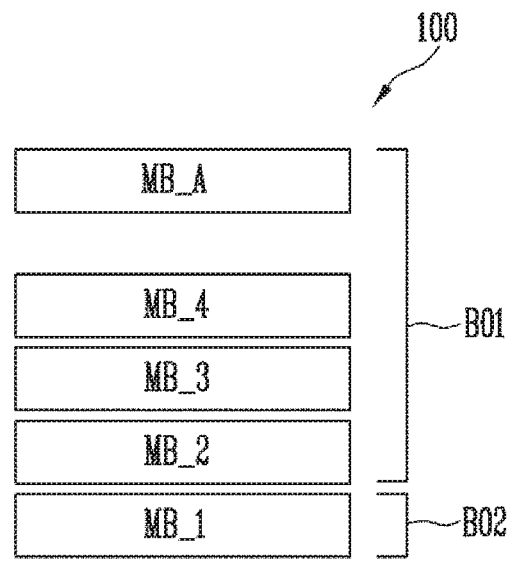
FIG. 3 is a diagram illustrating in detail a memory cell array of FIG. 2.

FIG. 3 is a diagram illustrating in detail the memory cell array of FIG. 2.

Referring to FIG. 3, the memory cell array 100 may include a plurality of memory blocks, for example, first to Ath memory blocks MB_1 to MB_A (A is a positive integer). User data may be stored in some memory blocks B01 among the first to Ath memory blocks MB_1 to MB_A, and system information necessary for an operation of the memory system 1000 may be stored in the other memory block B02.

The system information may include error injection information and error test information. The user data may be stored in the memory system 1000 in response to an external request. The error injection information may include error type information, target block information, target operation information, and the like. The error test information may include error injection result information, test result information, error address information, and the like.

Figure 4:
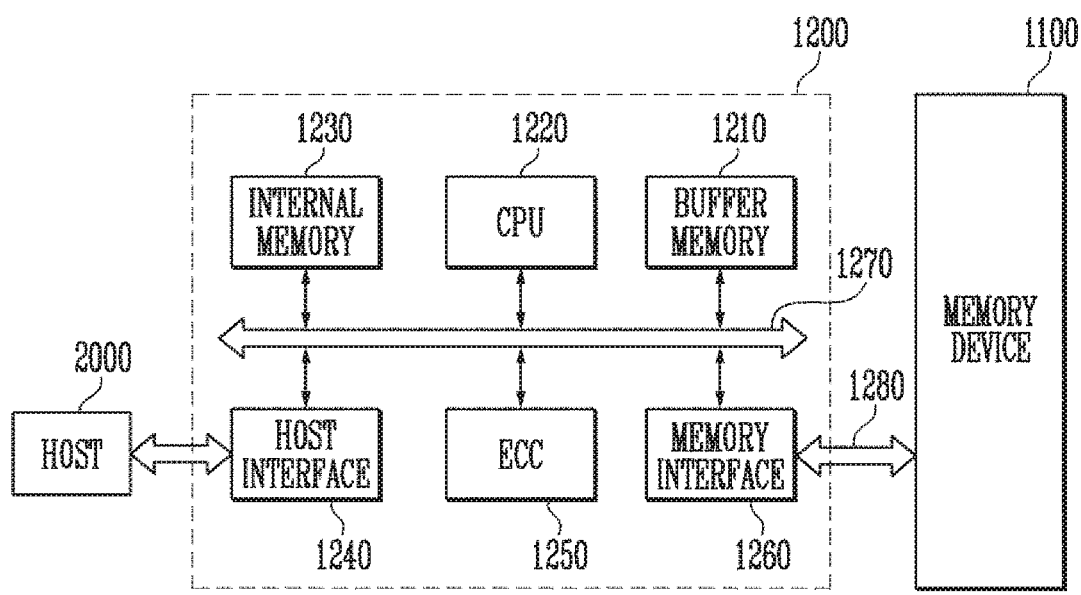
FIG. 4 is a diagram illustrating in detail a memory controller of FIG. 1.

FIG. 4 is a diagram illustrating in detail the memory controller of FIG. 1.

Referring to FIG. 4, the memory controller 1200 may include a buffer memory 1210, a central processing unit (CPU) 1220, an internal memory 1230, a host interface 1240, an error correction circuit (ECC) 1250, and a memory interface 1260 to control communication between the host 2000 and the memory device 1100. The buffer memory 1210, the CPU 1220, the internal memory 1230, the host interface 1240, the ECC 1250, and the memory interface 1260 may communicate with each other through a bus 1270, and the memory interface 1260 may communicate with the memory device 1100 through a channel 1280.

The buffer memory 1210 may temporarily store data communicated between the memory controller 1200 and the memory device 1100. For example, in a program operation, data to be programmed may be temporarily stored in the buffer memory 1210 before the data is transmitted to the memory device 1100. The stored data may be re-used when the program operation fails in response to the memory device 1100. Also, in a read operation, data read from the memory device 1100 may be temporarily stored in the buffer memory 1210. For example, if read data having a fixed capacity is tempo-rarily stored in the buffer memory 1210 in the read operation, the read data may be output to the host 2000 through the host interface 1240.

The CPU 1220 may perform various calculations for controlling the memory device 1100 or perform firmware. The CPU 1220 may control the memory controller 1200 to store error injection information in response to a request received from the host 2000, perform an error test operation, and output an error test result. For example, the CPU 1220 may generate an error test command in response to a request from the host 2000, and control the memory interface 1260 to transmit the error test command to the memory device 1100.

The internal memory 1230 may be implemented with an SRAM capable of storing various system information necessary for an operation of the memory controller 1200. For example, error injection information and error test information may be stored in the internal memory 1230.

The host interface 1240 may be configured to communicate with the external host 2000 coupled to the memory system 1000 under the control of the CPU 1220. For example, the host interface 1240 may receive a request for a specific operation from the host 2000, and transmit information output from the memory controller 1200 to the host 2000. In addition, a protocol may be changed depending on the host interface 1240.

The ECC 1250 may detect or correct an error included in data read from the memory device 1100. For example, the ECC 1250 may perform an error correction code (ECC) encoding operation based on data to be written in the memory device 1100 through the memory interface 1260. The data on which the ECC encoding operation is performed may be transferred to the memory device 1100 through the memory interface 1260. Also, the ECC 12250 may perform ECC decoding on data received from the memory device 1100 through the memory interface 1260. The ECC 1250 may perform an ECC operation, based on Bose, Chaudhuri, and Hocquenghem (BCH) code or Low Density Parity Check (LDPC) code.

The memory interface 1260 may be configured to communicate with the memory device 1100 under the control of the CPU 1220.

Figure 5:
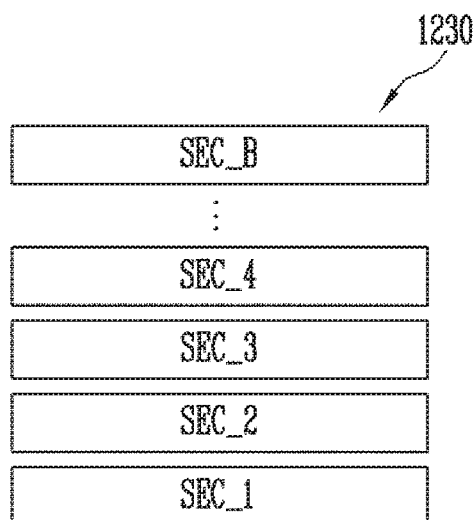
FIG. 5 is a diagram illustrating in detail an internal memory of the memory controller of FIG. 4.

FIG. 5 is a diagram illustrating in detail the internal memory of FIG. 4.

Referring to FIG. 5, the internal memory 1230 may be divided into a plurality of sectors, and data may be stored in each of the sectors. For example, the internal memory 1230 may include first to Bth sectors SEC_1 to SEC_B (B is a positive integer). Each of the first to Bth sectors SEC_1 to SEC_B may be configured to have 512 bytes, but is not limited to 512 bytes. Data pattern information and error injection information, which are received from the host 2000, may be stored in some sectors among the first to Bth sectors SEC_1 to SEC_B. In addition, error test information of the memory system 1000 may be stored in some sectors among the first to Bth sectors SEC_1 to SEC_B. The error test information may be stored in the sector in which the error injection information is stored, or be stored in another sector. A case where the error injection information and the error test information are stored in the first sector SEC_1 will be described as an example.

Figure 6:
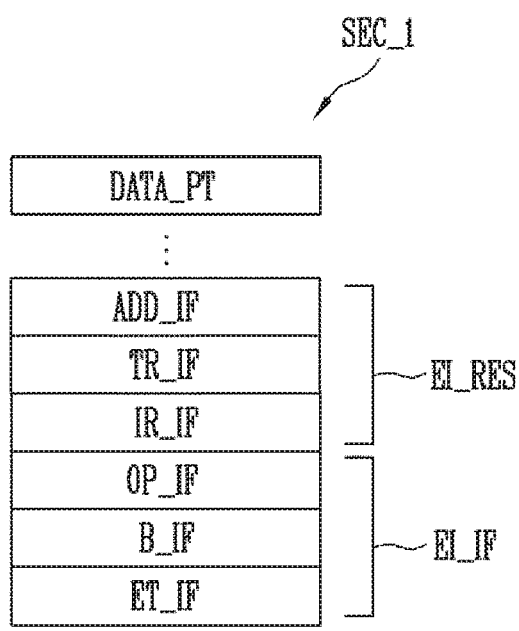
FIG. 6 is a diagram illustrating information stored in the internal memory according to an embodiment of the present disclosure.

FIG. 6 is a diagram illustrating information stored in the internal memory 1230 according to an embodiment of the present disclosure. The first sector SEC_1 of the internal memory 1230 will be described as an example.

Referring to FIG. 6, various information may be stored in the first sector SEC_1. For example, data pattern information DATA_PT, error injection information EI_IF, and error test information EI_RES may be stored in the first sector SEC_1.

The data pattern information DATA_PT may include information of various patterns defined between the host 2000 and the memory system 1000. For example, information on whether data is a pattern '0' or a pattern '1' may be included in the data pattern information DATA_PT. Also, information on whether the data is a pattern increased by '1' or a pattern decreased by '1' may be included in the data pattern information DATA_PT. Also, information on whether the data is an operating system (OS) pattern may be included in the data pattern information DATA_PT. In addition, various pattern information defined between the host 2000 and the memory system 1000 may be included in the data pattern information DATA_PT.

The error injection information EI_IF may be included together with the data pattern information DATA_PT in sector data, and the sector data may be transmitted from the host 2000 to the memory system 1000. For example, the error injection information EI_IF may include error type information ET_IF, target block information B_IF, target operation information OP_IF, and the like.

The error type information ET_IF may include information on an error type to be injected into the memory system 1000. For example, the error type may be a program type, a read type or an erase type. The target block information B_IF may include information on a memory device on which an error test is to be performed and addresses of a plane and a memory block.

The target operation information OP_IF may include information on an operation autonomously performed in the memory system 1000 without any request from the host 2000. For example, an internal operation may include an operation such as garbage collection, wear leveling or read reclaim.

The error test information EI_RES may include a result of the error test performed in the memory system 1000. For example, the error test information EI_RES may include error injection result information IR_IF, test result information TR_IF, error address information ADD_IF, and the like.

The error injection result information IR_IF may include information on whether an error injection operation has been properly performed. The test result information TR_IF may include information on whether processing of an error injected into the memory system 1000 has been properly performed. That is, when an error occurs, information on whether subsequent processing of the error has been properly performed in the memory system 1000 may be included in the TR_IF. The error address information ADD_IF may include information on an address at which an error occurs. For example, such information may include information on the address of a plane, memory block or page in which an error occurs in the memory device 1100.

Since the error test information EI_RES is on a result obtained by performing the error test operation in the memory system 1000, the error test information EI_RES may be temporarily stored in the first sector SEC_1 and then output together with sector data to the host 2000.

The error test operation performed in the memory system 1000 will be described in detail as follows.

Figure 7:
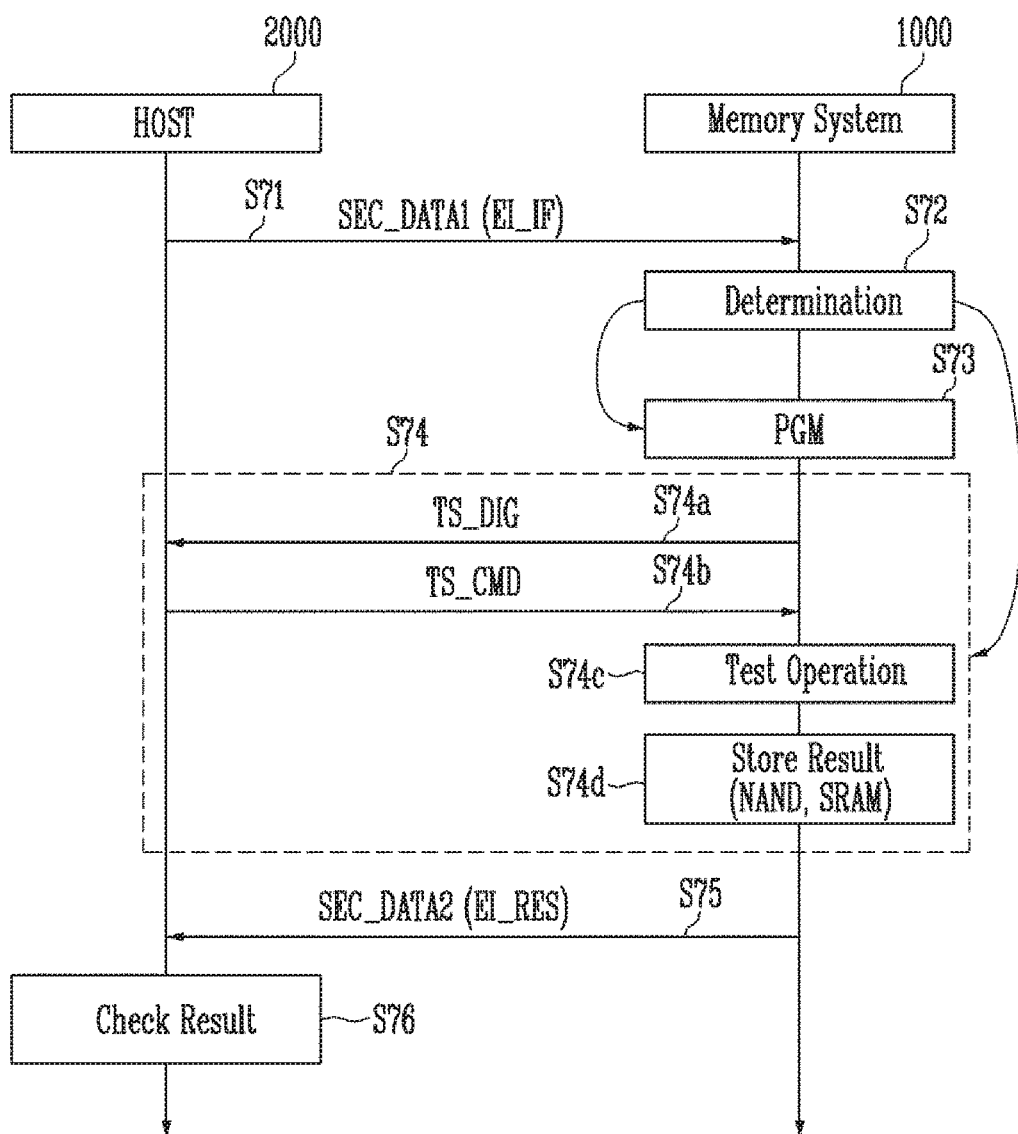
FIG. 7 is a diagram illustrating an error test operation according to an embodiment of the present disclosure.
Figure 8:
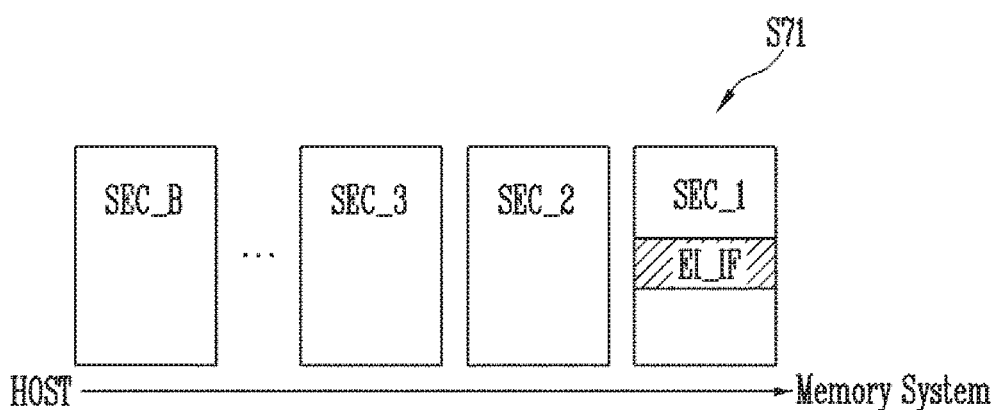
FIG. 8 is a diagram illustrating an operation of transmitting error injection information of FIG. 7.
Figure 9:
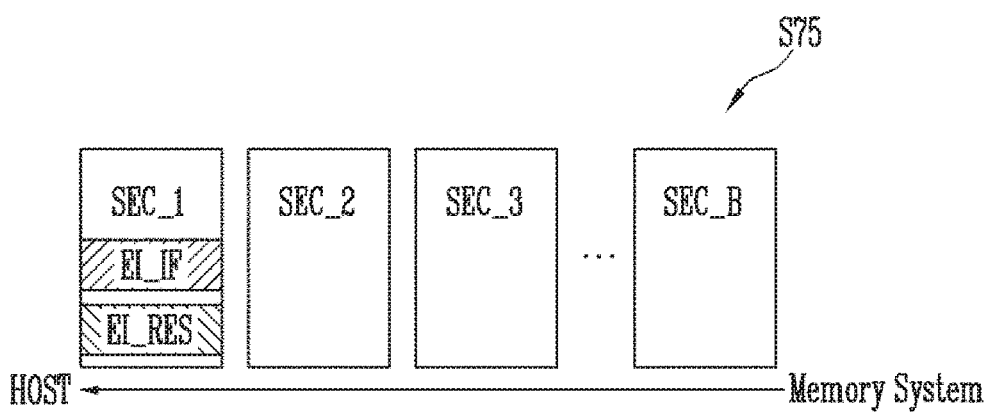
FIG. 9 is a diagram illustrating an operation of transmitting an error test result of FIG. 7.

FIG. 7 is a diagram illustrating an error test operation according to an embodiment of the present disclosure. FIG. 8 is a diagram illustrating an operation of transmitting error injection information of FIG. 7. FIG. 9 is a diagram illustrating an operation of transmitting an error test result of FIG. 7.

Referring to FIG. 7, the host 2000 may transmit first sector data SEC_DATA1 including error injection information EI_IF to the memory system 1000 at step S71. For example, the host 2000 may transmit a program command to the memory system 1000 and then transmit the first sector data SEC_DATA1 to the memory system 1000. Here, the program command may be a command generally used to program user data, and the first sector data SEC_DATA1 may include data divided into a plurality of sectors. The error injection information EI_IF may be included in any one sector among the plurality of sectors.

The step S71 will be described in more detail with reference to FIG. 8. The host 2000 may transmit the first sector data SEC_DATA1 in units of sectors to the memory system 1000. Here, the first sector data SEC_DATA1 may include all data of first to Bth sectors SEC_1 to SEC_B. For example, each of the first to Bth sectors SEC_1 to SEC_B may be configured to have 512 bytes, and the host 2000 may allow the error injection information EI_IF to be included in the data of any one sector, e.g., the first sector SEC_1 among the first to Bth sectors SEC_1 to SEC_B and transmit the data of the first sector SEC_1. The data of the first to Bth sectors SEC_1 to SEC_B may be sequentially transmitted to the memory system 1000.

Referring back to FIG. 7, if the first sector data SEC_DATA1 is received to the memory system 1000, the CPU 1220 (of FIG. 4) may determine at step S72 whether the error injection information EI_IF is included in the first sector data SEC_DATA1.

When the error injection information EI_IF is not included in the first sector data SEC_DATA1 as determined in step S72, the CPU 1220 may control the memory device 1100 to perform a regular program operation PGM at step S73. In this case, the process may end.

Returning to step S72, when the error injection information EI_IF is included in the first sector data SEC_DATA1 as determined in step S72, the CPU 1220 may store the error injection information EI_IF in the internal memory 1230 (of FIG. 4), and perform an error test operation at step S74.

In order to perform the error test operation at step S74, the CPU 1220 may output a test request signal TS_DIG to the host 2000 at step S74a. If the test request signal TS_DIG is received, the host 2000 may output a test command TS_CMD to the memory system 1000 at step S74b. The CPU 1220 of the memory system 1000 may perform a test operation on the memory device 1100 in response to the test command TS_CMD at step S74c.

The CPU 1220 may perform the test operation at step S74c according to the error injection information EI_IF stored in the internal memory 1230 in response to the test command TS_CMD received from the host 2000. For example, a test method of a program, read or erase operation may be determined according to error type information of the error injection information EI_IF. That is, the CPU 1220 may generate a program, read or erase command according to the error type information of the error injection information EI_IF. A memory device 1100 may be selected according to target block information included in the error injection information EI_IF, and a plane and a memory block, which are included in the selected memory device 1100, may be selected. That is, the CPU 1220 may perform an error test operation on the selected memory device 1100 according to the error type information and the target block information.

In addition, a test on an internal operation of the memory system 1000 may be performed according to target operation information OP_IF included in the error injection information EI_IF. Here, the internal operation may mean an operation autonomously performed by the memory system 1000 without any request from the host 2000. For example, an operation such as garbage collection, wear leveling or read reclaim may be performed as the internal operation.

Therefore, the test operation at step S74c may be performed according to the error injection information EI_IF stored in the internal memory 1230.

If the test operation at step S74c ends, error test information EI_RES on a result of the test operation of step S74c may be stored in the memory device 1100 at step S74d. For example, if the memory device 1100 is implemented with a NAND memory, the error test information EI_RES may be stored in a selected memory block (B02 of FIG. 3) among memory blocks included in the NAND memory.

The error test information EI_RES stored in the memory device 1100 may be temporarily stored even in the internal memory 1230 of the memory controller 1200. The internal memory 1230 may be implemented with an SRAM. If the error test information EI_RES is stored in the SRAM, the error test operation at step S74) may be ended.

The memory controller 1200 may output, to the host 2000, second sector data SEC_DATA2 including the error test information EI_RES stored in the internal memory 1230 at step S75.

The step S75 will be described in more detail with reference to FIG. 9. The memory system 1000 may output the second sector data SEC_DATA2 in units of sectors to the host 2000. Here, the second sector data SEC_DATA2 may include all data of the first to Bth sectors SEC_1 to SEC_B. The memory system 1000 may allow error test information EI_RES to be included in data of any one sector, e.g., the first sector SEC_1 among the first to Bth sectors SEC_1 to SEC_B and transmit the data of the first sector SEC_1. That is, the second sector data SEC_DATA2 obtained by updating the error test information EI_RES in the data of the first sector SEC_1 received from the host 2000 may be output to the host 2000. In the second sector data SEC_DATA2, the data of the first to Bth sectors SEC_1 to SEC_B may be sequentially transmitted to the host 2000 in an order received from the host 2000.

The host 2000 may check a result of the error test operation according to the error test information EI_RES included in the received second sector data SEC_DATA2 at step S76.

Figure 10:
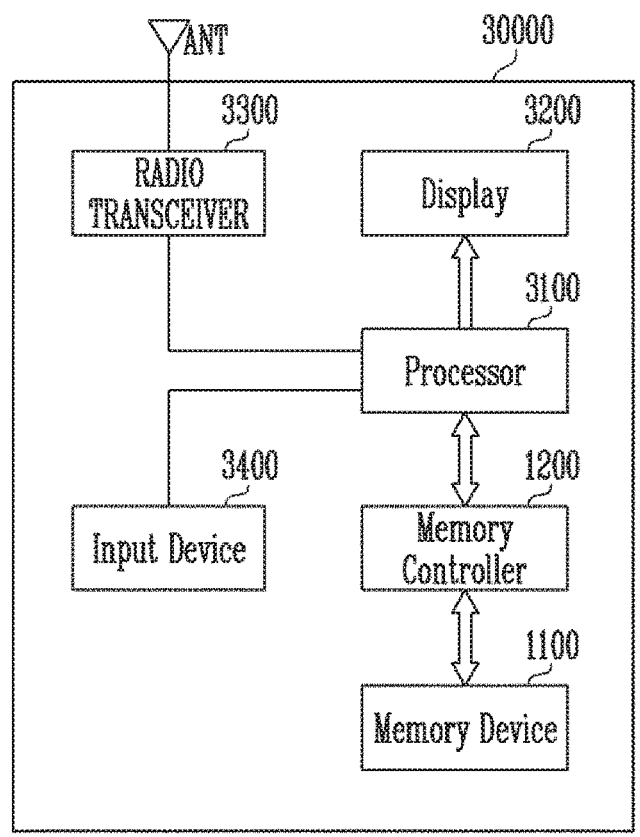
FIG. 10 is a diagram illustrating another embodiment of the memory system, including the memory controller and the memory device, shown in FIG. 4.

FIG. 10 is a diagram illustrating an embodiment of the memory system, including the memory controller and the memory device, shown in FIG. 4.

Referring to FIG. 10, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor memory device 1100. Also, the radio transceiver 3300 may convert a signal output from the processor 3100 into a radio signal, and output the converted radio signal to an external device through the antenna ANT. An input device 3400 capable of inputting a control signal for controlling an operation of the processor 3100 or data to be processed by the processor 3100 may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 11:
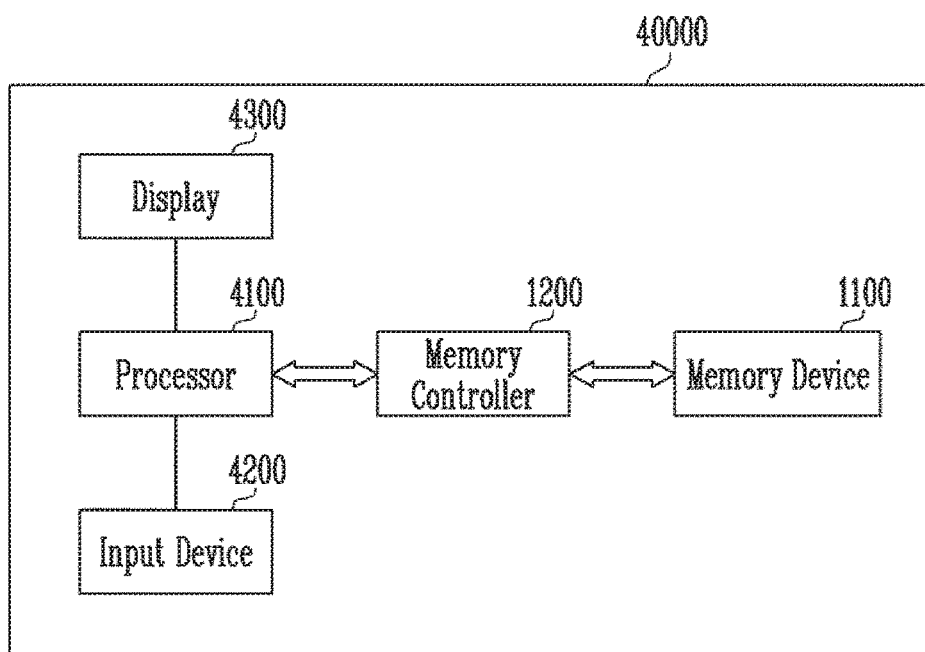
FIG. 11 is a diagram illustrating another embodiment of the memory system, including the memory controller and the memory device, shown in FIG. 4.

FIG. 11 is a diagram illustrating an embodiment of the memory system, including the memory controller and the memory device, shown in FIG. 4.

Referring to FIG. 11, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 12:
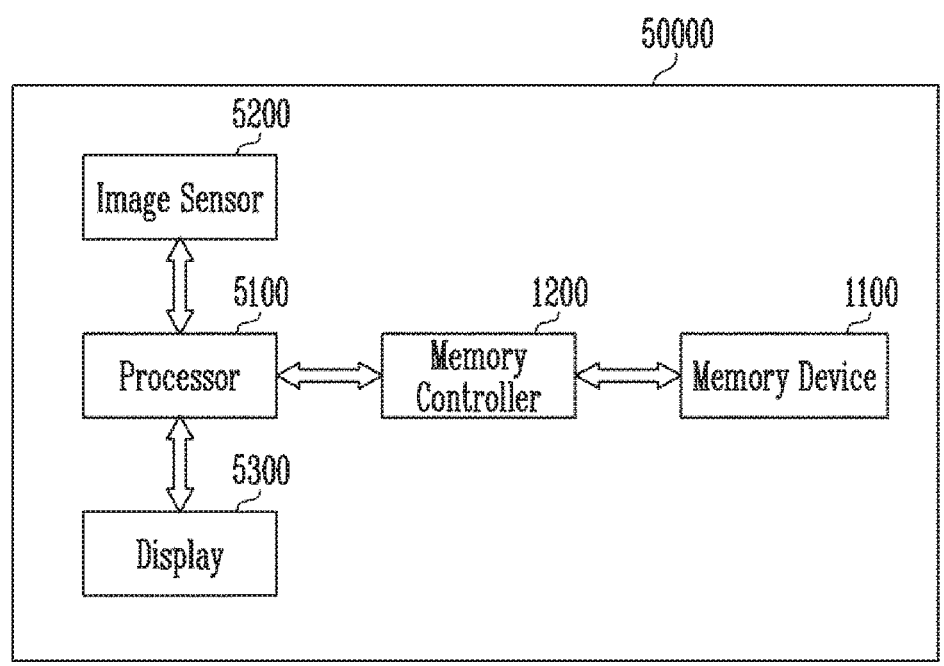
FIG. 12 is a diagram illustrating another embodiment of the memory system, including the memory controller and the memory device, shown in FIG. 4.

FIG. 12 is a diagram illustrating an embodiment of the memory system, including the memory controller and the memory device, shown in FIG. 4.

Referring to FIG. 12, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 13:
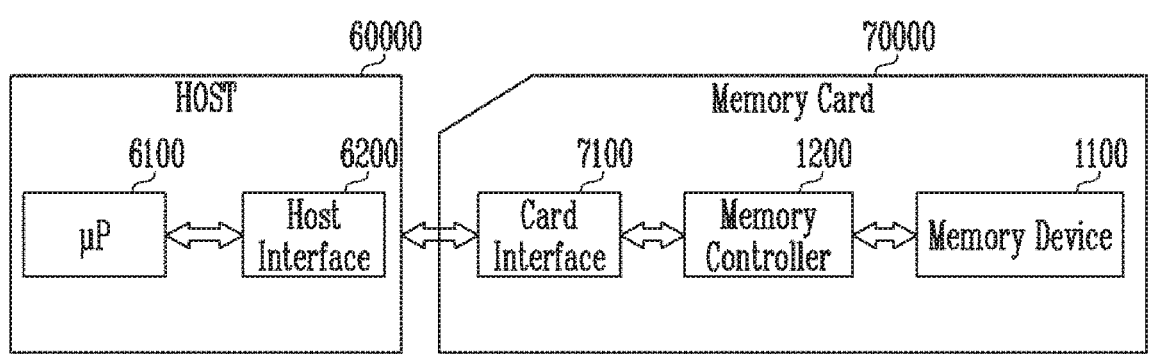
FIG. 13 is a diagram illustrating another embodiment of the memory system, including the memory controller and the memory device, shown in FIG. 4.

FIG. 13 is a diagram illustrating an embodiment of the memory system including the memory controller and the memory device, shown in FIG. 4.

Referring to FIG. 13, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor (μP) 6100.

According to embodiments of the present disclosure, an error test can be performed without limiting any protocol between the host and the memory system.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
an internal memory configured to store error injection information for an error test operation and error test information that is a result of the error test operation; and
a central processing unit configured to receive first sector data from a host, and perform an error test operation on a memory device according to the error injection information, in response to the error injection information included in the first sector data.

2. The memory controller of claim 1, wherein the internal memory is implemented with a static random-access memory (SRAM) for storing system information in addition to the error injection information and the error test information.

3. The memory controller of claim 1, wherein the central processing unit determines whether the error injection information is included in the first sector data received in response to a program command received from the host.

4. The memory controller of claim 3, wherein the central processing unit allows a data pattern to be included in the first sector data or allows the data pattern and the error injection information to be included in the first sector data.

5. The memory controller of claim 3, wherein, in response to the error injection information not included in the first sector data, the central processing unit controls the memory device to perform a program operation in response to the program command.

6. The memory controller of claim 4, wherein data of a plurality of sectors are included in the first sector data,
wherein, in response to the error injection information included in the first sector data, the data pattern and the error injection information are included together in any one sector among the sectors.

7. The memory controller of claim 1, wherein, in response to the error injection information included in the first sector data, the central processing unit stores the error injection information in the internal memory, generates a test request signal, and then transmits the test request signal to the host.

8. The memory controller of claim 7, wherein, in response to a test command received from the host after the test request signal is transmitted to the host, the central processing unit performs the error test operation on the memory device in response to the test command.

9. The memory controller of claim 1, wherein the central processing unit stores the error test information in the memory device and the internal memory after the error test operation is performed.

10. The memory controller of claim 1, wherein the error injection information includes:
error type information including information on an error type;
target block information including information on the memory device to perform the error test operation and addresses of a plane and a memory block included in the memory device; and
target operation information including information on an internal operation autonomously performed by the memory device without any request from the host.

11. The memory controller of claim 10, wherein the central processing unit controls the memory device to perform the error test operation by generating a program, read, or erase command according to the error type.

12. The memory controller of claim 10, wherein the internal operation includes a garbage collection operation, a wear leveling operation, or a read reclaim operation.

13. The memory controller of claim 1, wherein the error test information includes:
error injection result information including information on whether an error injection operation has been properly performed;
test result information including information on whether subsequent processing of an error has been properly performed; and
error address information including information on an address at which the error occurs.

14. The memory controller of claim 1, wherein, in response to an end of the error test operation, and the error test information stored in the internal memory, second sector data included in the error test information is output to the host.

15. A memory system comprising:
a memory device configured to store data; and
a memory controller configured to receive error injection information from a host, perform an error test operation on the memory device by generating a program, read or erase command according to the error injection information, and output error test information that is a result of the error test operation to the host,
wherein the memory device includes a plurality of memory blocks for storing the data,
wherein user data is stored in some memory blocks, among the plurality of memory blocks, and the error injection information and the error test information are included in a different memory block, among the plurality of memory blocks.

16. The memory system of claim 15, wherein the memory controller includes:
an internal memory configured to store the error injection information and the error test information; and
a central processing unit configured to receive first sector data from the host, and perform the error test operation on the memory device according to the error injection information, in response to the error injection information included in the first sector data.

17. The memory system of claim 16, wherein, in response to the error injection information not included in the first sector data, the central processing unit controls the memory device to perform a program operation.

18. The memory system of claim 15, wherein the error injection information includes:
error type information including information on an error type;
target block information including information on the memory device to perform the error test operation and addresses of a plane and a memory block included in the memory device; and
target operation information including information on an operation internally performed without any request from the host.

19. The memory system of claim 15, wherein the error test information includes:
error injection result information including information on whether an error injection operation has been normally performed by the memory controller;
test result information including information on whether subsequent processing of an error has been normally performed; and
error address information including information on an address at which the error occurs.

* * * * *